United States Patent
Peixoto Machado Da Silva et al.

(10) Patent No.: US 10,185,563 B2
(45) Date of Patent: *Jan. 22, 2019

(54) CONTROL MODULE FOR MULTIPLE MIXED-SIGNAL RESOURCES MANAGEMENT

(71) Applicant: INESC TEC—INSTITUTO DE ENGENHARIA DE SISTEMAS E COMPUTADORES, TECNOLOGIA E CIÊNCIA, Porto (PT)

(72) Inventors: José Alberto Peixoto Machado Da Silva, Vila do Conde (PT); Miguel Fernando Paiva Velhote Correia, Matosinhos (PT); António José Salazar Escobar, Ermesinde (PT)

(73) Assignee: INESC TEC—INSTITUTO DE ENGENHARIA DE SISTEMAS E, Porto (PT)

( * ) Notice: Subject to any disclaimer, the term of this patent is extended or adjusted under 35 U.S.C. 154(b) by 0 days.

This patent is subject to a terminal disclaimer.

(21) Appl. No.: 15/922,385

(22) Filed: Mar. 15, 2018

(65) Prior Publication Data

US 2018/0275990 A1     Sep. 27, 2018

Related U.S. Application Data

(63) Continuation-in-part of application No. 15/129,208, filed as application No. PCT/IB2015/052141 on Mar. 24, 2015, now Pat. No. 9,921,835.

(30) Foreign Application Priority Data

Mar. 24, 2014 (PT) .......................................... 107537

(51) Int. Cl.
*G06F 9/30* (2018.01)
*G06F 13/42* (2006.01)
(Continued)

(52) U.S. Cl.
CPC ........ *G06F 9/3005* (2013.01); *G06F 9/30101* (2013.01); *G06F 13/4068* (2013.01);
(Continued)

(58) Field of Classification Search
CPC ............. G06F 9/30; G06F 13/42; G06F 13/40
See application file for complete search history.

(56) References Cited

U.S. PATENT DOCUMENTS

| | | | |
|---|---|---|---|
| 6,237,112 B1 | 5/2001 | Yoo et al. | |
| 6,915,397 B2 * | 7/2005 | Lubbers ................ | G06F 3/0605 707/999.202 |

(Continued)

FOREIGN PATENT DOCUMENTS

| | | |
|---|---|---|
| CN | 1599343 A | 3/2005 |
| CN | 102866967 A | 1/2013 |

OTHER PUBLICATIONS

Escobar, A. et. al., "An I2C based mixed-signal test and measurement infrastructure", 19th Annual Internation Mixed-Signals, Sensors, and Systems Test Workshop Proceedings, pp. 1-6, Sep. 17, 2014.

*Primary Examiner* — Henry Tsai
*Assistant Examiner* — Christopher A Daley
(74) *Attorney, Agent, or Firm* — Leason Ellis LLP (57) ABSTRACT

The present solution targets independent or inter-dependent resource management scenarios such as multi-sensor and other scenarios of possible process/component sharing, intended for individual or group synchronized core task management as part of a flexible long-term solution for monitoring, self-calibration, built-in self-testing, measurements and/or group synchronization dependant strategies. An extension to I2C/I3C compatible instruments is described. Disclosed is a module comprising an interpreter sub-module, for receiving and responding to I2C/I3C sequences and a register bank module comprising a plurality (Continued)

of registers for storing values. The disclosed module and method of operation can be used for initialization, measurement, and resource management through mixed-signal analog bus scheduling, synchronization and group addressing for built-in calibration strategies for example.

10 Claims, 7 Drawing Sheets

(51) Int. Cl.
*G11C 29/02* (2006.01)
*G06F 13/40* (2006.01)

(52) U.S. Cl.
CPC ...... *G06F 13/4221* (2013.01); *G06F 13/4282* (2013.01); *G11C 29/028* (2013.01); *G06F 2213/0016* (2013.01)

(56) References Cited

U.S. PATENT DOCUMENTS

| | | | | |
|---|---|---|---|---|
| 6,927,961 B2 * | 8/2005 | Schestak | ................ | G06F 1/206 |
| | | | | 361/103 |
| 6,931,487 B2 * | 8/2005 | Lubbers | .............. | G06F 11/2092 |
| | | | | 711/114 |
| 7,146,237 B2 * | 12/2006 | Lev-Ami | ......... | G05B 19/41875 |
| | | | | 700/121 |
| 7,787,477 B2 * | 8/2010 | Sifnatsch | .......... | H04L 29/12349 |
| | | | | 370/230 |
| 2002/0056063 A1 | 5/2002 | Nerl | | |

* cited by examiner

Fig. 1

○ SWA:

○ SRA:

CONTROL MODULE FOR MULTIPLE MIXED-SIGNAL RESOURCES MANAGEMENT

CROSS-REFERENCE TO RELATED APPLICATIONS

This application is continuation-in-part of U.S. application Ser. No. 15/129,208, filed Sep. 26, 2016, now U.S. Pat. No. 9,921,835, issued Mar. 20, 2018, which is a U.S. National Stage Application under 35 U.S.C. § 371 of International Patent Application No. PCT/IB2015/052141, filed Mar. 24, 2015, which claims priority to Portugal Application No. 107537, filed Mar. 24, 2014, which are hereby incorporated by reference as if set forth in their respective entireties herein.

TECHNICAL FIELD

The present invention relates to a module and its method of operation, that may be implemented as a PLD (programmable logic device, FPGA (field-programmable gate array), an integrated circuit, or similar substrate.

BACKGROUND ART

The circuits' components and sensors are vulnerable to aging, usage, environmental and physical issues, various unforeseen factors, either within laboratory controlled set-ups or field application scenarios, representing a growing concern for data reliability. This is a particular issue in safety critical applications of, namely, medical and automotive electronic systems.

Such data reliability issues have been addressed through a number of ad hoc strategies or a mixture of standards mostly directed to digital scenarios; however, multi-sensors scenarios seldom benefit from such approaches.

CN102866967 discloses an I2C (inter-integrated circuit) equipment management method. According to said document, multiple I2C equipment on one host machine equipment can be effectively managed. However, this solution targets the issue of limited I2C bus addresses, in particular within scenarios where a number of devices of the same type need to be accessed individually while sharing same I2C address (or a limited subset). Thus, the before mentioned solution is limited to accessibility management issues and does not allow intra and inter module synchronization, and/or has an associated extended I2C instruction set.

Document US 2012/066423 A1 describes a solution to facilitate expansion of a single I2C bus to multiple devices. This solution presents several problems, such as the centralization of the device accessibilities through a common expander module. Although such approach allows for multi-casting and broadcasting capabilities to devices with a common address, the methodological approach creates a bottleneck through the described expander module. Such limitation does not allow for distributed scalability and for physically grouping devices to a specific expander module. Furthermore, the solution presented does not allow for intra and inter module synchronization, since targets only communication accessibility flexibility.

In general, prior art solutions do not allow flexible, configurable and expandable granular addressability through a de-centralized approach. Moreover, the associated set of mechanisms and instructions hereby described, introduce intra- and inter-module synchronization and/or management, extendable to mixed-signal circuits, sensors, and all device type and extension while I2C complaint.

DISCLOSURE OF INVENTION

The present solution targets intra and inter modular scenarios and other independent or inter-dependent resource scenarios, intended for resource management as part of a methodology applicable to a number of system scenarios such as, but not limited to, sensor/components long-term monitoring for calibration, testing, measurements and/or group synchronization strategies for data analysis.

It is described an extension to I2C or I3C compatible instruments. An integrated module, referred to from now on as Setup, Capture, Process and Scan (SCPS) module, is described. The SCPS modules themselves are to be subdivided in four sections:

an I2C/I3C interpreter, following UM10204, "I2C-bus specification and user manual", standard mode with 10-bit slave address capabilities;

an SCPS interpreter, a superset of instructions to expand upon I2C/I3C functionality, introducing group addressing capabilities and embedded instructions within target module group referencing;

a switching/control section, intended for routing management of optional associated control aspects, such as an analogue bus; and a register bank, for control of response sequence, flag declaration and other observability and controllability aspects.

Analogously, other implementations of a serial computer bus may be used in the place of I2C. In particular, the overall present disclosure is applicable to I2C or I3C. Also, the overall present disclosure is applicable with straightforward adaptations to a SPI bus.

The proposed mechanism is structured around four operation types. Such operations are to be managed through a set of registers and instructions accessed through an I2C, or I3C, bus.

An overview of the before mentioned operations follows:

Setup: intended for intra-modular event independent setup of settings/registers of the target devices; considered for device configuration. Example actions include: signal/pattern preloading, sampling settings, grouping of components, BIST handling procedure, and user defined parameters input.

Capture: intended to manage inter-modular event dependent scenarios, such as signal/pattern loading/generation, data collection and BIST activation.

Process: intended for intra-modular event dependent scenarios, such as data processing and decision making algorithms activations. An example of such operations is the comparison of collected data reflected through updates of target registers that can be used to follow sensor history, global reference upkeep or specific reference comparison. Localized algorithm/heuristics such as general signal processing routines, least mean square (LMS) strategies, Kalman filters, Markov's chains, etc., can be activated through these operations.

Scan: intended for data and instruction distribution, as to cover inter-modular event independent tasks. Possibilities of interfacing with external elements for setup and data gathering modes are considered at this stage.

The present solution represents an augmentation to an I2C, or I3C, bus interpreter, with extended features which maintain full backwards compatibility. It also constitutes a framework with flexibility to be adapted for an electronics designer's purposes.

It enables a master in a common I2C, or I3C, bus to read or write, as well as control through a given set of instruction, all slave modules, groups of slave modules or any slave module individually that is connected to the I2C, or I3C, bus: it thus adds granular accessibility to I2C/I3C.

It also enables a master in a common I2C, or I3C, bus with synchronized access to multiple slave modules connected to the I2C, or I3C, bus.

Furthermore, with the SCPS handler add-on, it also allows the same effects as in effects 1 and 2 to be extended to analog and/or digital elements of the system as well, by adding a controllability and observability management source handled through the SCPS module.

It speeds up the communication, in certain scenarios, between a master and several slaves by reducing the length of the involved sequences. Particularly in cases where the target READ/WRITE register has the same address among the involved modules, reducing the operation to one group sequence (SWA or SRA depending on the case) instead of multiple device specific sequences.

It also speeds up and simplifies the slave to slave transfer of data, by adding the capability of a master controlled transfer of a register from one slave (which provides the register) to another (which receives the register) in a single operation.

Furthermore it facilitates the synchronization of inter-module actions from a global and group specific perspective, by providing flags, registers and optional control elements that facilitate the coordination of inter-module actions through a common instruction set format and resources.

It facilities the implementation of token strategies through the use of global instruction set for resource request, which instantiates a mechanism for resource availability verification.

It also provides operation locking mechanism, i.e., a sub-set of instructions permits to reduce the functionality of the SCPS module as to limit a module's response. Such is intended to serve as a mechanism for isolating a member of group in case of detected mal-function or fault.

Furthermore, it expands the I2C, or I3C, established GENERAL CALL instruction set as to permit RESET or global impacting actions (such as modules isolation, bypass, etc., required during an initialization or re-calibration event).

It facilitates inter-module sequential and instantaneous operations through an instruction sub-set (i.e., CAPTURE instructions), which when properly utilized can synchronize the individual module actions as to permit a group operation, which can be updated sequentially through user defined parameters and specific instruction flow, thus reducing the communication sequences and possibly reducing resources by permitting synchronized re-utilization.

It also reduces, in certain scenarios, the resources that would be required to perform the same operations within multiple modules by permitting resource re-use through the inter-module action synchronization and management.

Furthermore, it reduces the need for individual 7-bit I2C, or I3C, addresses through the use of a shared group address, 10-bit or 8-bit, and the member address, thus providing flexibility in the individual addressing scheme and reducing dependence to the available 7-bit address domain.

The present solution provides implementation flexibility, while permitting compatibility with numerous commercial sensors through the use of I2C, or I3C, as the communication bus. Such approach also permits the inclusion of commercially available sensors (I2C/I3C compatible) within the testing/calibration strategies by expanding their functionality; consequently offering a mixed-signal test and measurement infrastructure. Furthermore, the solution addresses the specificities of continuous long term sensor based monitoring solutions.

BRIEF DESCRIPTION OF DRAWINGS

The following figures provide preferred embodiments for illustrating the description and should not be seen as limiting the scope of the invention.

BEST MODE FOR CARRYING OUT THE INVENTION

Herein are described optional embodiments in more detail, which however are not intended to limit the scope of the present application.

SCPS Module

In one embodiment, the SCPS module is composed of two add-ons sections to current I2C, or I3C, compatible designs: an I2C, or I3C, Interpreter add-on (SCPS interpreter), and a Register Bank add-on (SCPS registers). Optionally, a third one is also comprised by the SCPS module: an element bank add-on (SCPS handler).

The I2C, or I3C, Interpreter add-on (SCPS interpreter) counts with the mechanism for a sequence identifier for SCPS associated command sequence recognition, as well as the corresponding response mechanism for updating flags, registers and elements of the SCPS module, and I2C, or I3C, signal responses that are SCPS associated (e.g. proper acknowledges to SCPS instructions); both for write and read I2C/I3C sequences, which, from now on, will be referred to as SCPS Write Action (SWA) and SCPS Read Action (SRA), respectively, when such I2C/I3C sequences are associated to a SCPS sequence.

The interpreter identifies three types of addressing formats: global (referred to as GENERAL CALL within the I2C specifications UM10204), group (reachable through two types of selectable alternatives) and specific (associated to I2C 7-bit address format or through the use of a group member identifier through SCPS instructions). The traditional I2C 7-bit address remains fully compatible for such instruments that have an associated 7-bit address, and will cause the SCPS interpreter to ignore any sequence accompanying such, thus permitting the instrument to be accessible through direct I2C means (thus no additional referring in this document to such type of addressing will be included).

For global addressing, the SCPS interpreter will expect a formatted SCPS Global Instruction (SGI) after a GENERAL CALL (all zeroes as defined by I2C specifications, i.e., 8h00) and acknowledge accordingly. An overview of corresponding SGIs and their actions can be found in the instruction set section bellow and a description of the sequence flow can be found on the workflow section.

Regarding the group addressing, for flexibility two group addressing formats are permitted: 10-bit addressing format or alternate protocol format. The 10-bit addressing formats considers that the SCPS compliant modules which conform a group have a shared 10-bit I2C/I3C address referred to as 10-bit Group Address (10GA).

Figure 1:
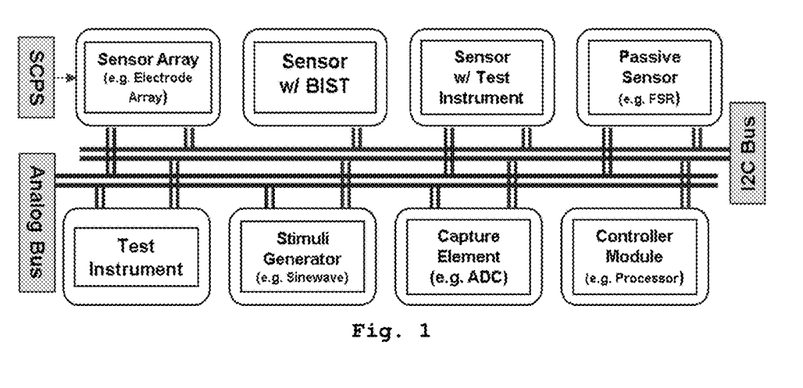
FIG. 1 shows a schematic representation of an example embodiment of SCPS modules as part of a resource management scheme.
Figure 2:
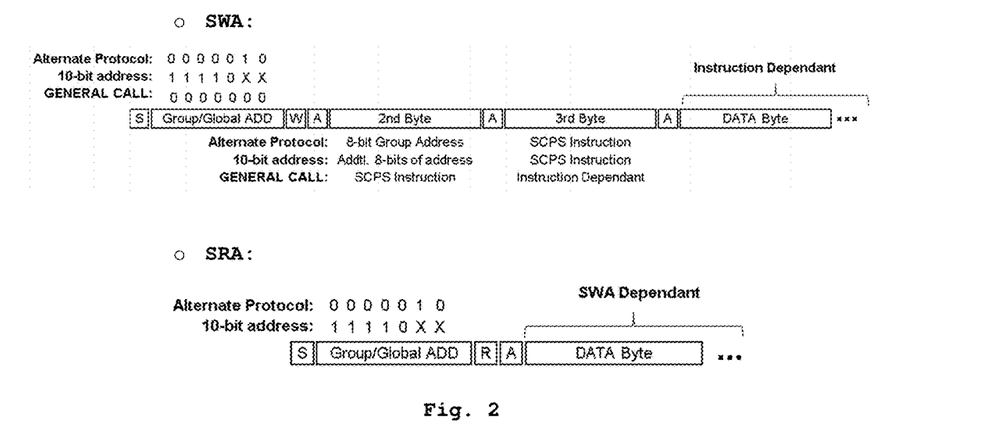
FIG. 2 shows a schematic representation of SCPS Write Action (SWA) and SCPS Read Action (SRA) type sequences that permit the write and read in a group manner, as well as synchronized interdependent and independent actions among SCPS compatible instruments.

In the case of the alternate protocol format, the reserved 7-bit I2C address 7b0000010 (reserved for using different protocols and formats) is used as a sequence starter that the SCPS protocol is to be utilized with and an 8-bit Group Address (8GA) is then expected as a second byte in the case of a write sequence. For a read sequence a previous write access to a specific 8GA is expected following the same flow as 10-bit I2C/I3C read. Both group addressing formats, access the same SWA and SRA type sequences. The SCPS sequences follow I2C/I3C compatible write/read sequences formats, thus remaining fully compatible with I2C or I3C compliant devices, and noted variations on the expected format must not affect I2C compliant devices (insured by following compliance with I2C UM10204). The referred sequences can be generally described as in FIG. 2.

The Register Bank add-on (SCPS registers) is the second add-on section to current I2C/I3C compatible designs. SWA/SRA sequences access associated registers, hereby referred to as SCSP registers, for their corresponding retrieval and update, some of which updated in a sequential manner and will be referred to as pointers. Pointers have a reserved number 00h. The default size of SCPS registers is bits (optional byte multiple sizes are foreseen for future compatibility). Although, not registers themselves, a set of USER DEFINED PARAMETERS or UDP are associated to the SCPS registers. UDP refers to all parameters that are instrument specific, such as the default starting pointer positions and register values (e.g., the default fall back value of a register after a RESET or the pre-established starting pointer address for specific instructions).

The mandatory registers are:
- an INSTRUCTION REGISTER or INSTR, updated through SWA sequences, for storing the last valid SWA entered instruction, and configured to reset to 8h00 value as default, as an indication that no valid SCPS instruction has been received or a RESET action has been requested;
- a STATE REGISTER or STATE, with the general purpose to serve as an instrument control register that permits internal setting configuration of the instrument, being used by specific instructions to define the selected instrument "state" for a specific action, said STATE REGISTER being configured to store the current action state of the instruction, said state being retrieved from an optional user-defined state library (containing UDP) or through data bytes of certain instructions;
- a STATUS REGISTER or STATU, being the default READ output register, i.e., when a SRA sequence is received by a group with no specification of the target register (allowed for certain instructions or if only 2-byte SWA sequence is sent), said STATUS REGISTER being by default composed by an aggrupation of defined internal flags, which reflect the internal status of the SCPS module;
- a GROUP ADDRESS or GADDR, which can be in the before mentioned 10GA or 8GA format, such register containing the group address information of the module and can be dynamic (i.e. programmable), where the address 8h00 is reserved as a NULL address and cannot be assigned to any group;
- a MEMBER ADDRESS or MADDR register containing the member address information of the module, i.e. the relative position of the module within the group. This register can be dynamic, where the address 8h00 is reserved as a NULL address and cannot be assigned to any module;
- a WRITE REGISTER POINTER or WRP register configured to store the target register address to be written to, said register possibly being updated through certain instructions and instructions' specifiers, or extending a write sequence for certain instructions (i.e., as when an ACK and additional SCK pulses are sent after the first data write byte of an I2C/I3C write sequence), where the value 8h00 is reserved as a NULL address and signifies that no action will occur to the pointer during this instruction sequence,
where the initial value of the pointer during a specific instruction is set by UDP, if none it should default to 00h, and
where all matters concerning increment and decrement of the pointer are to be addressed by the user through interaction with the SCPS Register section;
- a READ REGISTER POINTER or RRP that stores the target register address to be read from, said register being possibly updated through the use of certain commands or extending a read sequence (i.e., as when acknowledgement and additional SCK pulses are sent after the first read byte of an I2C/I3C read sequence),
where the value 8h00 is reserved as a NULL address and signifies that no action will occur to the pointer during this instruction sequence,
where the initial value of the pointer during a specific instruction is set by UDP, if none it should default to 00h, and
where all matters concerning increment and decrement of the pointer are to be addressed by the user through interaction with the SCPS Register section;
- a GROUP WRITE POINTER or GWP that stores the member address to be written to,
where the match of the GWP to the MADDR indicates the module that the DATA BYTE is to be stored at the WRP address,
where the update of the GWP is instruction specific and its initial value is dependent on the instruction and UDP,
where certain instructions can auto increment the pointer in a style reflective of the I2C/I3C register pointer auto increment (left to the user within the I2C standard), which is utilized by most I2C compliant mechanism to simplify multiple read and write operations, where the value 8h00 is reserved as a NULL address and signifies that no action will occur to the pointer during this instruction sequence. The response of the module for an 8h00 GWP is equivalent to a NO match scenario, where the initial value of the pointer during a specific instruction is set by UDP, if none it should default to 00h, and where all matters concerning increment and decrement of the pointer are to be addressed by the user through interaction with the SCPS Register section; and a GROUP READ POINTER or GRP that stores the member address to be read from, where the match of the GRP to the MADDR indicates the module's RRP register DATA BYTE is to serve as an OUTPUT in the upcoming I2C/I3C READ sequence, where certain instructions can auto increment the pointer in a style reflective of the I2C/I3C register pointer auto increment (left to the user within the I2C standard), which is utilized by most I2C compliant mechanism to simplify multiple read and write operations, where the value 8h00 is reserved as a NULL address and signifies that no action will occur to the pointer during this instruction sequence, where the behaviour of the module for an 8h00 GRP is equivalent to a NO match scenario, and where such register can also be incremented by extending a read sequence (i.e., as when acknowledgement and additional SCK pulses are sent after the first read byte of an I2C/I3C read sequence); however, as within I2C the increment or decrement is left to the user.

The optional registers are:

a TOKEN REGISTER(s) or TKR, which serves as a TOKEN space where each bit, or set of bits, represents a specific TOKEN, that stores the information of the associated resources that have been assigned to a specific module, where in the case of only one shared resource (such as an analogue bus) then simplification can be achieved by usage of the RQST flag; and a USER DEFINED REGISTERS or UDR, which refers to all registers associated to the instrument/device itself and therefore defined by its designer, where such registers include all instrument I2C/I3C accessible registers that have been defined by the user, where if access through the SCPS module is intended by the user, then allocation is expected within the SCPS registers by providing addressable retrieval and update to its user defined location, and where such UDR are by definition not standard, thus remains the responsibility of the designer to establish the necessary elements and flow if intended for cross-module actions.

The Element bank add-on (SCPS handler) is an optional add-on that can be integrated into the SCPS module to serve as switching/element library, as to manage controllability and observability through switches and the functionality of other elements. Such elements can be either digital or analog and their configuration is the responsibility of the designer. The SCPS handler is to be controlled mainly through the STATE, allowing to pre-establish configuration to manage routability and functionality of the instrument. An example of such add-on would be a routing dictionary connected to the enable pins of analog switches, which permit access to an analog bus. The dictionary would then translate a STATE to a target connection scheme; additionally, such library could also activate a built-in self-test (BIST) mechanism or other functional aspect of the instrument. Such add-on is optional, since direct usage of SCPS module's flags and registers (internally accessible by the instrument) can be used directly for the same purposes for simple scenarios.

Figure 3:
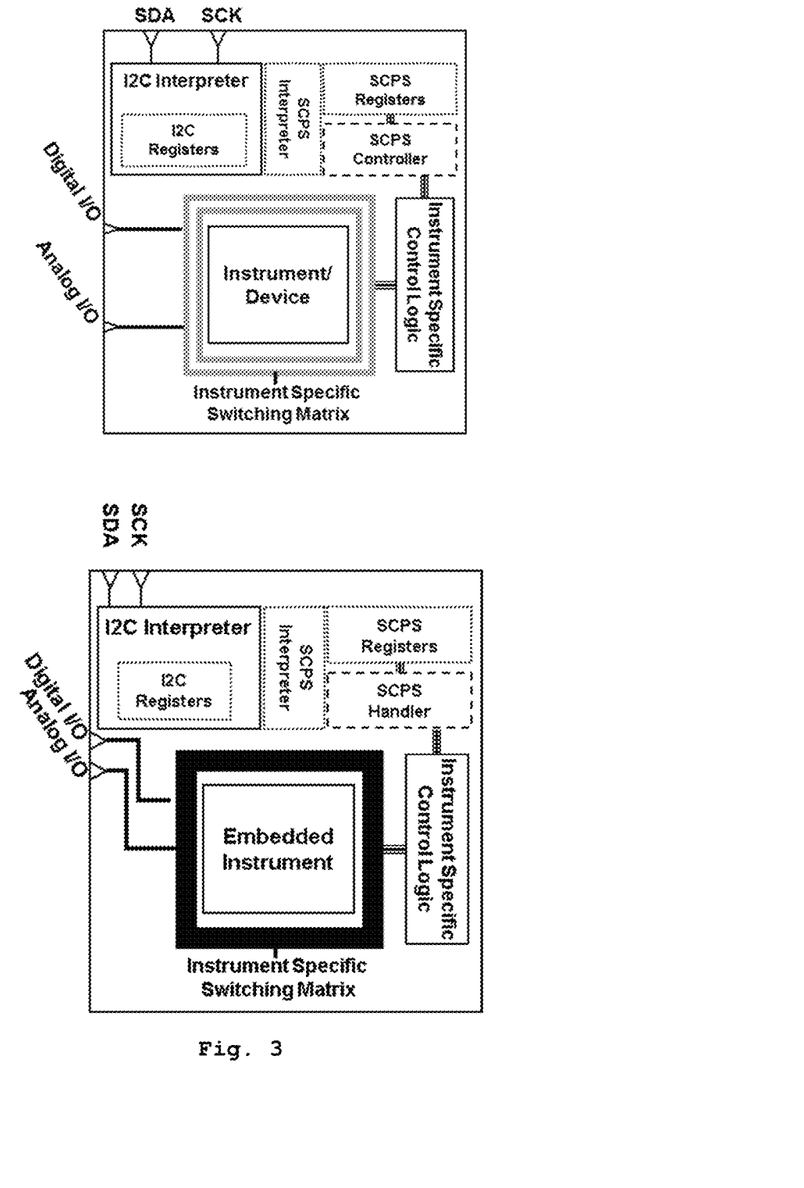
FIG. 3 shows a schematic representation of a modular representation of a generic SCPS module implementation.

The before mentioned add-ons are illustrated and highlighted on FIG. 3.

Description of Workflow

There exists flexibility with regards of the associated workflow of the before described implementation, however, the intention is the simplification of inter-modular actions and event management. Although, apparently complex while compared to the simplicity of a two operation strategy such as the one presented by the I2C UM10204 (through the use of write and read operation, ignoring optional special operations such as GENERAL CALL, START BYTE, etc.), the SCPS instruction set follows a similar approach with its SWA and SRA, expanding upon the functional capabilities of the conventional I2C write and read operations.

Figure 4:
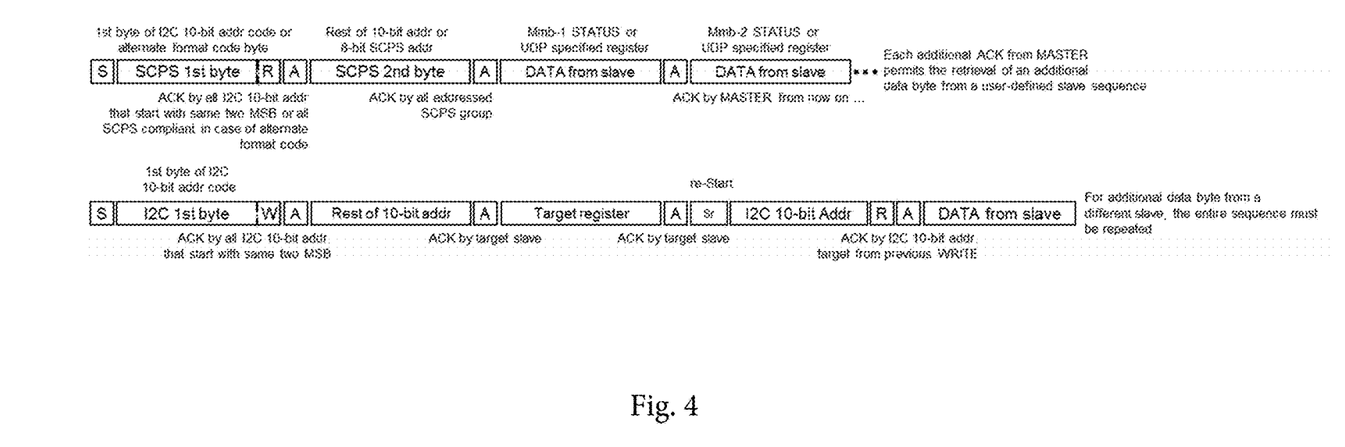
FIG. 4 shows a generic data and operation flow for multiple device reads.
Figure 5:
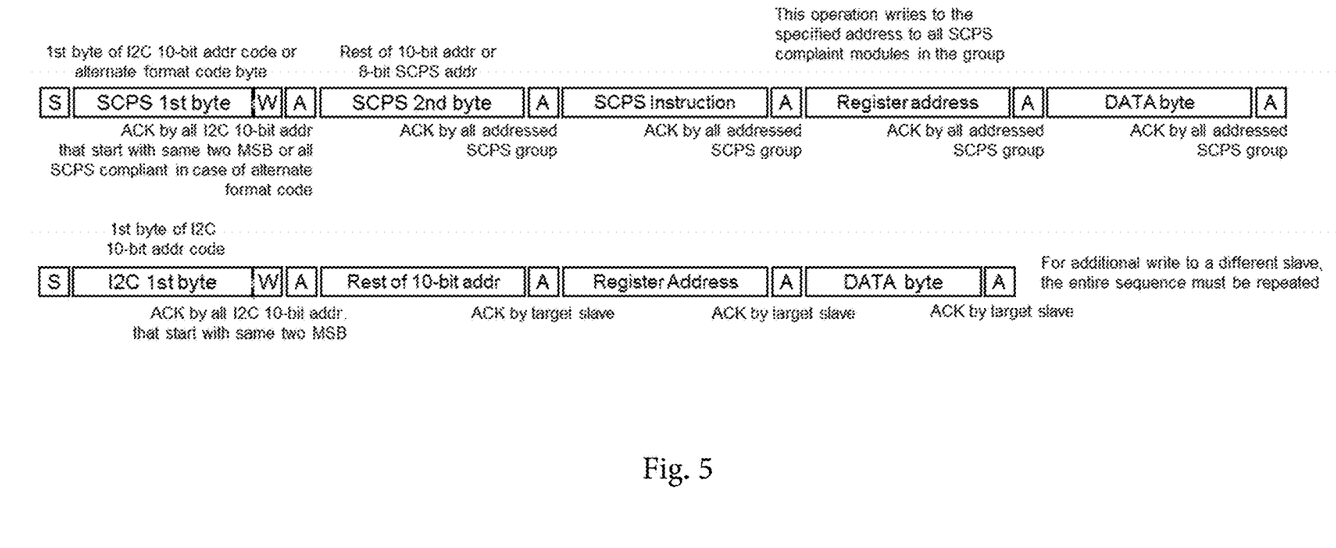
FIG. 5 shows a generic data and operation flow for multiple device writes.
Figure 6:
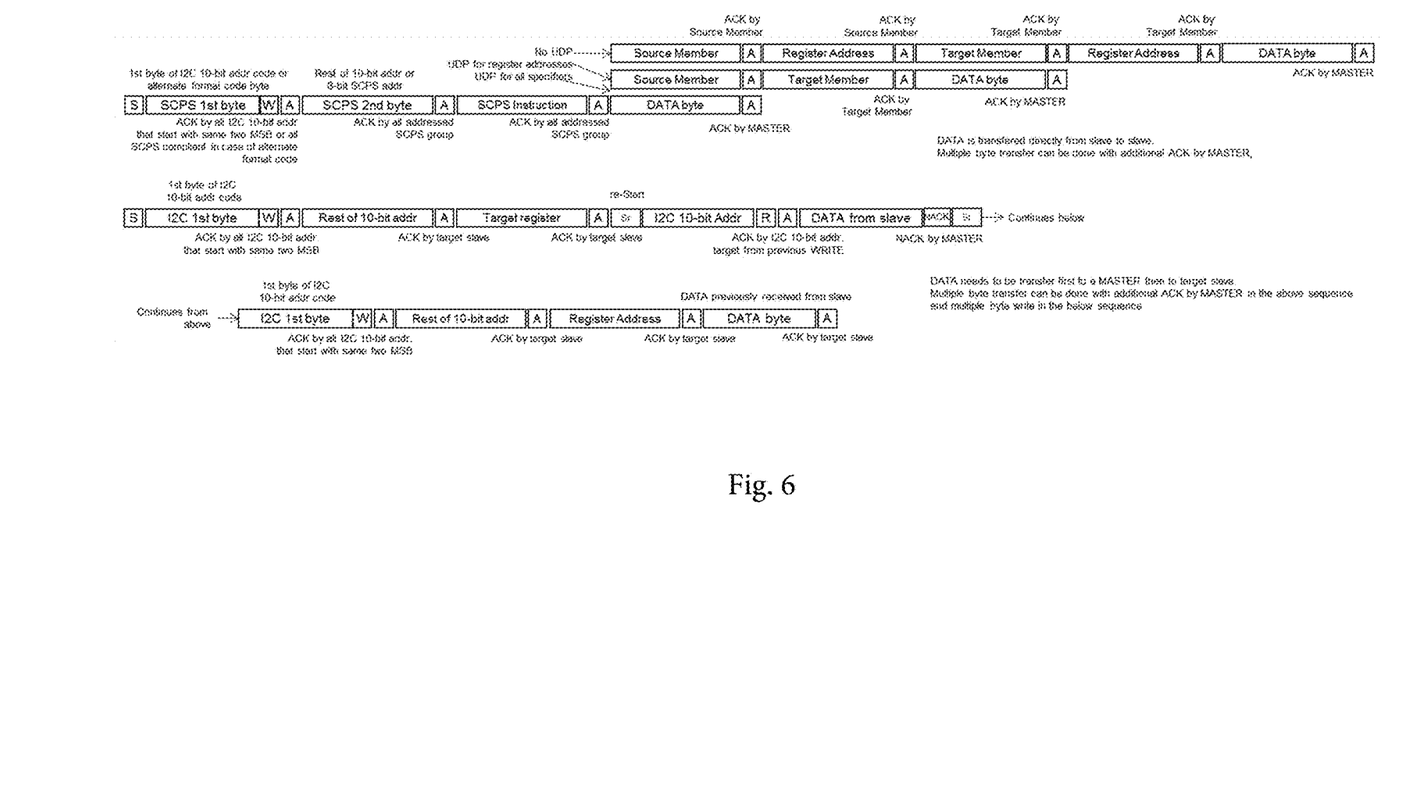
FIG. 6 shows a generic data and operation flow for multiple devices transfers.

The use of a common interface structure among instruments permits that the associated flags, registers, pointers and functional responses serve a standardizing role that minimizes the internal mechanism knowledge required to interface instruments that are intended to be used by multiple modules, thus reducing the overall need for resources (through instrument reuse) and communication overhead (by simplifying the communication scheme). In FIGS. 4 to 6, there are some of examples of the data and operation flow, compared to I2C, as to better perceive the benefits of SCPS compliance at the communication level.

The addressed granularity strategy presented permits multi-slave reads in a compressed sequence as presented in FIG. 4, which significantly reduces the communication overhead when compared to the conventional I2C sequences.

FIG. 5 illustrates the generic representation of the SCPS instruction sequenced, compared to conventional I2C write sequences. Noteworthy, broadcasting strategies presented by other solutions permit accessibility where only block sequences can be achieved; which differs from the presented approach that allows for coordinated sequences and multi-slave coordinated reads.

Finally, FIG. 6 presents generic representation of transfer sequences that clearly presents the advantage of the presented approach, since read/write operations between slave members can be coordinated without the need for sequential data reads and writes.

From a more practical point of view, the SCPS module permits not only the functional expansion of the conventional I2C operations, through its instruction set, but when associated to a SCPS handler, serves to synchronize and manage functional and routing aspects of the instruments as well; by introducing the notion of group actions.

Instruction Set

The associated instructions, which are introduced through SWAs and are divided in four categories: SETUP, CAPTURE, PROCESS, and SCAN (such categories are so named because of the SCPS framework methodology, however they represent four distinct instruction types independently of the scheme utilized). Each instruction follows specific updates of the associated flags, registers and pointers, which are described in this instruction section. The SRAs have specific responses depending on the current valid instruction (SWA introduced) as to permit a simplification of the transfer of data, a general description of the instruction and data flow is described on the workflow section.

Future instructions can be introduced through the use of the SCPS instruction format that is not reserved for mandatory instructions. Optional instructions can also make use of the vacant options in the instruction domain, however no response is to be expected by the SCPS registers, flags and other elements. This said, the instruction can be directly interpreted by the instrument upon examination of the I2C/I3C data in register. Custom instruction sets can therefore be formulate using the vacant instruction domain space, with particular updates to the SCPS registers, flags and elements; such instruction sets, custom in nature, would have to consider their particularity when coordinating inter-modular actions. In all cases, the specific instrument response is not defined for any SGI, SWA or SRA, such is to be specified by the instrument designer based on the mandatory and optional flags, registers and pointers, with the understanding that standardized behavior across SCPS compatible instruments can thus be synchronized only through inter-module coordination.

The instructions will be described based on the address type, be it global (from a GENERAL CALL), group or specific. Although, specific addressing was referred to in this scenario to the access of an instrument through the use of an I2C 7-bit address, it is also possible to select a specific member of a group for an isolated action, which is of use when the group members do not have an I2C 7-bit address associated to them. From this point on, such style of addressing will be referred to as member-specific addressing or MSAddr, which entails a subsection of the permissible instructions.

The global instruction set is meant for actions that affect all SCPS recipient modules simultaneously (e.g., a RESET or initialization request), although specific instrument response is dependent on the particularities of the design, e.g., in the case of a RESET instruction, not all instrument are expected to reset their registers and internal elements in the same manner (for instance, SCPS register will reset based on specific UDPs). When the SCPS Handler is present and analog switches are being utilized for signal routing configurations, some possible global request can be BYPASS and ISOLATE, referring to operation time transparency and module isolation from analog buses respectively. The global instruction is introduced after a GENERAL CALL (all zeroes in the first byte, i.e., 8h00), and uses the software GENERAL CALL space by having the least significant bit set to 'zero'. In order to avoid conflict with I2C UM10204 established instructions, the most significant bit is set to 'one'.

The global instruction set comprises the following instructions:
  the STATE instruction modifies the STATE register as to permit a general action to take place such as a RESET, ISOLATION or BYPASS setup. The instruction clears the pointers and INSTR to 8h00, STATE is updated with the corresponding instruction associated UDP, which has the default of 8h00. The internal flags are cleared and all TOKEN flags are released, except for a GLOBAL flag which is set. All recipient SCPS modules ACK such instruction. Additional bytes can follow; however, will be ignored by the SCPS module.
  the LOCK instruction sets the SCPS modules into the corresponding level of LOCK. By LOCK is meant different levels of functional limitation of the SCPS module in order to provide a mechanism for limiting the actions of a group member or members (such as in the case of detected malfunction or fault), where LOCK of level 0 means: no lock, all instructions and operations are permitted.
  Should be noted that LOCK instructions do not affect the registers or flags except for those specific to LOCK instructions, so care must be taken. Additional levels can be introduced using the remaining space in the instruction domain.
  All recipient SCPS modules ACK such instruction.
  Additional bytes can follow, however will be ignored by the SCPS module.
  the REQUEST instruction has the purpose for multiple masters to be able to coordinate the use of shared resources through availability verification. The REQUEST instruction sequence differs from the previous two instructions types, since only members that have the associated TOKEN assigned to them produce an ACK (assigned to them from a previous request), if no ACK is received the MASTER continues with a second byte with the rest of the 10-bit group address (in case of 10GA which used the YY for the first two MSBs) or the 8GA (in this case the YY become don't cares). The group specified then sets its RQST flag and corresponding TKR.

The group instruction set is meant for inter-module actions and for member specific actions as well (the previously referred MSAddr). The INSTRUCTION is introduced at the third byte of a SWA.

The INSTRUCTION byte indicated the type of instruction, in case of a mal-form instruction it should be ignored by the SCPS Module. In such a case the GROUP flag would remain set as in the case of a two byte SWA, generally used to precede a SRA. If the instruction corresponds to a member specific instruction the fourth byte would be assumed to be the member address and any data byte after such would be associate to instruction specifiers. Non-specifiers based instruction are related to pre-established strategies based on UDP, and utilized for streamlining repetitive actions and avoiding long and complex instructions and repetitions. Any additional data byte after the INSTRUCTION byte for a non-specifiers instruction would be ignored by the SCPS module. Additional INSTRUCTION bytes can be considered for significantly extending the command domain. Follows a description of the group instruction set by type.

The setup instruction set or SIS, is reflective of operations intended to write or update the registers of the involved modules. This can be done through the use of pre-established UDP dependent STATES or through direct WRITE of a register or registers. Additionally, it provides the RELEASE of LOCK states or of shared resources (by clearing the TOKEN register specific bit). The involved modules ACK the INSTRUCTION byte; however in the case of member-specific instructions, only the target member will ACK its MADDR and specifiers.

The setup instruction set comprises the following instructions:
  the RESET instruction clears the pointers, flags and restore registers to their default value (8h00 by default if no UDP). Only the GRP flag remains set as to permit a follow-up SRA.
  the STATE instruction updates the STATE register and the INSTR register, the only flags updated are the GROUP flag identifying if it's a group or member specific targeted instruction. They are intended to serve for pre-establish setup access through UDP.
  WRITE: these instructions are used for direct register writing through the use of the register address as a specifier, in the same manner one would write to a I2C/I3C associated register the difference lies in that for group instructions the WRITE occurs in multiple modules, allowing the updating of multiple module simultaneously. The strategy for auto increment or decrement of the register address (in a manner consistent with most I2C compliant devices) is left to the designer as stated previously (keeping in accordance to the I2C UM10204).
  LOCK: permits the change of the LOCK level of the module (information stored in the LOCK flags). The LOCK levels follow the same behavior as the GLOBAL LOCK instruction.

RQST RELEASE: permits the release of a specific shared resource, through the clearing of the group holder TOKEN bits and RQST flag, which is also achievable through the use of a GLOBAL RESET or STATE.

The capture instruction set or CIS, is reflective of operations intended to synchronize inter-module actions that have dependency among the module, e.g., synchronized measurements from multiple modules or a measurement that requires multiple modules to participate. This can be done through the use of pre-established UDP dependent STATES or through "on-the-fly" setups through the use of specifiers.

The instructions are sub-divided into two types: stand-by (STBY) and capture (CAPT). Depending of the module and the instrument response the two instruction could serve identical functions, they differ mainly in the flag setting and in their conceptual purpose. The STBY instruction are meant for actions that require a waiting period, e.g., a settling period for a stimuli, as to permit a proper measurement. The CAPT instruction is meant to indicate the start of a measurement or test (possible following a STBY). Additionally, an END-CAPT instruction has been included to signal an end of the capture event, useful in cases where the capture event is not instantaneous and requires of an intentional interrupt of the process. The involved modules ACK the INSTRUCTION byte; however in the case of member-specific instructions, only the target member will ACK its MADDR and specifiers. The clearing of the STBY and CAPT related flags only occur after an END-CAPT or a RESET style instruction (allows for setup, process and scan actions in parallel).

The capture instruction set comprises the following instructions:

STBY: the instruction can include or not specifiers, thus utilizing default UDP for the latter case. A Nxt-STBY instruction updates the STATE register as to permit access to sequential STBY setups (e.g., for modifying the routing for a sensor array as to permit sequential measurements of its elements or performing a multiple steps measurement such in the case of a frequency sweep). The STBY instruction with specifiers may differs from the regular instruction format by having no pre-established length, and only the pertinent member will ACK after its MADDR and the next DATA byte. That is to say, all members read the incoming DATA bytes in groups of two, the $1^{st}$ byte representing the MADDR, and the $2^{nd}$ byte the specifier.

CAPT: the instruction can include or not specifiers. If no specifier follows that a setup has been previously established through a STBY instruction. It is also possible to use the CAPT instruction without a previous STBY in cases where no setup is required. As previously described, a END-CAPT permits to end the capture action. Similar to the STBY the CAPT instructions may permit "on-the-fly" setup and capture, the different being on the CAPT flags being set as to indicate the start of the capture action instead of the STBY flag.

The process instruction set or PrIS, is reflective of operations intended to synchronize inter-module actions that have no direct inter-module dependency, e.g., synchronized internal module operations for multiple modules or the processing of a FAULT status by the involved modules (as to permit the overall FAULT status of a group). This can be done through the use of pre-established UDP dependent STATES or through the use of specifiers, both at a group level or member-specific; e.g., the process instructions can follow a successful capture as to properly update the FAULT flags; however, no restriction is made of the instruction sequence usage.

The process instruction set comprises the following instructions:

PSET: the instruction has several versions, both with and without specifiers and at group and member specific level. It is similar to CAPT in behavior, although updating the FAULT and PROC flags instead of the CAPT flags. The FAULT flags are directly updated by the instrument and are intended to serve as a FAULT status indicator, however the details and usage are left to the instrument designer. Additionally, the PrIS does not update the STATE register, thus a capture and process operation could take place in parallel. In case that the FAULT flags or the internal FAULT state determination of the instrument requires an action affecting the "state" of the module, a STATE register bypass to a response specific UDP, outside of the SCPS interpreter (within the instrument itself or by intercepting the SCPS interpreter to SCPS handler path) can be performed. If required, external LOCK pins can be optionally available to force a LOCK state through external hardware. It should be mentioned that process action can be made STATE aware, as well as utilize the SCPS flags for initiating process actions only on the modules of interest, e.g., updating the FAULT status of the module that is a test target while in a STBY process.

The scan instruction set or ScIS, is reflective of operations intended to read or transfer (read from and write to) registers of the involved modules. This can be done through the use of pre-established UDP or the use of specifiers. The involved modules ACK the INSTRUCTION byte; however in the case of member-specific instructions, only the target member will ACK its MADDR and specifiers.

The scan instruction set comprises the following instructions:

READ: the read instruction allows for a register to be read from multiple modules or a member-specific module through the I2C/I3C bus. It differs from conventional I2C strategies which simplifies the read operation through the R/W bit in the first byte of the transaction, allowing for register selection through the last write operation. In this case, the variation permits the chain read from multiple modules, significantly reducing the transaction bytes since no back and forth read and write instructions must be performed. This is achieved by using the pointers to determine the target module and target register to be read from; however, instead of the increment or decrement alter the target register as in conventional I2C strategies here the target module can be update permitting a READ instruction to contain chained information from multiple modules. Alternatively a READ can use UDP for reading pre-established registers and even changing the module being read from, since the increment or decrement of the modules is left to the designer. The READ instruction with specifiers allows for selecting the target register to be read from, while the additional N° of REGs allows to control the number of increments per module that will be read.

TRNF: the transfer instruction allows for a register to be read from a module and written to a different location or module (depending on the UDP). It differs from conventional I2C strategies which only consider master-slave operation and not slave-to-slave data transfer.

As with the READ, the TRNF allows for pre-established transfers. The specifier variation allow the choosing of the source and destiny module. During a transfer the 9-bit ACK is controlled by a third party Master in order to avoid the RX and TX modules to ACK themselves, thus impeding a Re-Start of Stop event and locking the I2C/I3C bus. If one of the involved modules is serving as the Master, then proper ACK behavior should be follow to avoid infinite cycles.

The SRA operations by default reads the STATUS register from the modules in a group, in the order determined by the UDP; however, the update of the pointers is left to the designer (as stated previously) so information from the SCPS flags and STATE register can be used to permit user-defined reads, which are referred to as fast-reads. This is permitted deliberatively and can be extended to permit transfer operations as well (the write pointers need not to be set to 8h00 upon the start of a SRA, although it is a default value), which are referred to as fast-transfers. An example of a useful fast-transfer is when a module is responsible for the digitalization of a measurement (contains an ADC for instance), however the data needs to be allocated on a different module (the target of the measurement for instance), in this manner a fast-transfer permits to hold the elements in a STBY, transfer the data and continue with a different measurement (through a STBY-NEXT or CAPT instruction).

Other Embodiments

In some embodiments, the SCPS module assumes that non-SCPS compliant devices connected to the shared I2C/I3C bus are compliant with the UM10204 I2C standard.

In some embodiments, all electrical and timing considerations are the responsibility of the IC designer and should comply with the UM10204 I2C standard and any additional standard being applied.

In some embodiments, in the case of using a 10-bit I2C/I3C address format for the identification of the systems group, it is assumed that the address is unique in the system and does not coincide with non-SCPS compliant devices connected to the shared I2C/I3C bus.

In some embodiments, in the case of using a 8-bit I2C address format for the identification of the systems group, it is assume that the use of the alternate protocol reserved 7-bit address will not conflict with additional alternate protocols connected to the shared I2C/I3C bus, i.e. the only devices that respond to the alternate protocol address are SCPS compliant.

In some embodiments, optional I2C/I3C features such as arbitration, clock stretching, etc., are the responsibility of the IC designer and should be implemented in such a manner that does not conflict with SCPS operations.

In some embodiments, the I2C/I3C interpreter is implemented in such a manner that provides the SCPS module sufficient controllability and observability of the SDA and SCK lines.

In some embodiments, the registers associated to the I2C/I3C interpreter (those accessible through I2C/I3C sequences) are when considered within the SCPS register must be directly accessible to the SCPS module.

In some embodiments, the user defined registers and parameters are properly formatted.

In some embodiments, the IC response to a SCPS operations is the sole responsibility of the designer.

In some embodiments, any routing conflict which might occur due to unforeseen configuration applied through the SCPS module are the sole responsibility of the system designer.

In some embodiments, when using the SCPS module for token strategies, it is assumed that the involved modules will verify the availability of the resource prior to usage and it is the responsibility of the designer to implement any related safeguards.

In some embodiments, safeguards related to system and/or user safety are the responsibility of the system designer.

In some embodiments, the inter-module action coordination assumes that an understanding or pre-establish operation time definition of responses, between the designers of the involved instruments.

In some embodiments, the electrical and timing considerations that might need to be considered during inter-module operations are the responsibility of the system designer.

In some embodiments, the SCPS module, operations and framework are intended for facilitating inter-module and intra-module data operations, measurements and testing; however, the specific actions of the involved instruments are the responsibility of the designer, including are electrical and timing considerations. Any damage or injury which might occur while having the SCPS modules implemented are therefore the responsibility of the designer.

Figure 7:
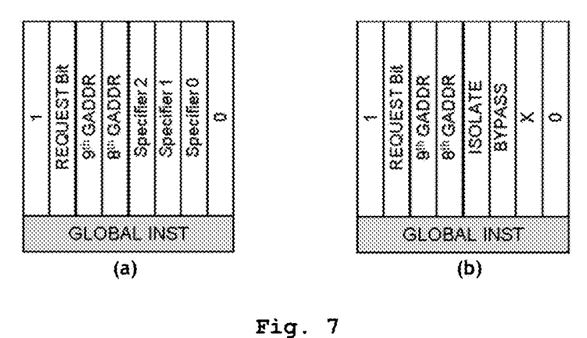
FIG. 7 illustrates a Global Instruction format with (a) Generic extended format and (b) Simplified implemented format.

The global instruction set enables actions that affect all SCPS recipient modules (e.g., a RESET or initialization request), although specific instrument response is dependent on the particularities of their design; e.g., in the case of a RESET instruction, not all instruments are expected to follow an identical sequence for resetting their registers and internal elements (for instance, SCPS registers will reset based on specific UDPs). For the current embodiments, some possible global requests are BYPASS and ISOLATE, referring to operation time transparency and module isolation from analogue buses respectively. The global instruction is introduced after a GENERAL CALL (all zeroes in the first byte, i.e., 8h00), and uses the software GENERAL CALL space by having the least significant bit set to 'zero'. In order to avoid conflict with I2C UM10204 established instructions, the most significant bit is preferably set to 'one', as can be seen in FIG. 7, where FIG. 7 (a) presents a generic global instruction format, and FIG. 7 (b) presents an embodiment case specific format. The following table shows examples of possible Global Instructions according to the present disclosure.

| | GLOBAL instructions summary | |
|---|---|---|
| Vector | Instruction Type | Description |
| 10000000 | SCPS General RESET | Indicates a SCPS general RESET. |
| 10??XXX0 | STATE Instruction | Modifies the STATE register as to permit a general action to take place such as a RESET, ISOLATION or BYPASS setup. The instruction clears the pointers and INSTR to 8H00, STATE is updated with the corresponding instruction associated UDP, which has the default of 8H00. The internal flags are cleared and all TOKEN flags are released, except for the GLOBAL flag which is set. All recipient SCPS modules ACK such instruction. |

GLOBAL instructions summary

| Vector | Instruction Type | Description |
|---|---|---|
| | | Additional bytes can follow; however, will be ignored by the SCPS module (as to be used by user defined instruction extensions). In the present case only two such instructions were defined which where ISOLATE and BYPASS to be activated independently from each other (i.e., the 10??11?0 is considered to be an ignore instruction). |
| 11XX???0 | REQUEST Instruction | Differs from the previous instructions, since only members that have the associated TOKEN assigned to them produce an ACK, if no ACK is received the MASTER continues with a 2nd byte that contains the rest of the 10-bit group address. The group specified then sets its RQST flag and corresponding TKR. The purpose is for multiple groups to be able to coordinate the use of shared resources through availability verification. |

It is also possible to select a specific member of a group for an isolated action, i.e. for a member specific instruction, which is of use when the group members do not have an associated I2C 7-bit address. In the context of the present disclosure, such style of addressing is preferably referred to as member-specific addressing, which entails a subsection of the permissible instructions.

Figure 8:
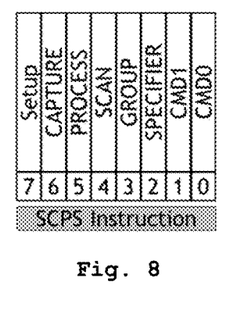
FIG. 8 illustrates a SCPS instruction format.

The following is an example application of Group and Member Specific Instructions. The group instruction set is meant for inter-module actions and for member specific actions as well. The instruction is introduced at the $3^{rd}$ byte of a SWT, and follows the format previously presented in FIG. 8. The four MSBs are reserved to indicate the instruction type, which is restricted to only one set ('1') bit at a time. Multiple ones (1's) in these four MSBs, of the instruction byte, are treated as a mal-form instruction and ignored by the SCPS Module. In such a case the GROUP flag would remain set as in the case of a two byte SWT, generally used to precede a SRT. The $4^{th}$ LSB (GROUP bit) indicates, if set ("1"), that the instruction is a group wide instruction; if unset it signifies a member specific instruction, in which case the $4^{th}$ byte contains the member address and any data byte after such would be associate to specifiers. The $3^{rd}$ LSB is associated to a specifiers based instruction, indicating that the instruction will require an additional set of data bytes for its completion. An unset SPECIFIER bit would imply a non-specifiers based instruction, which are related to pre-established strategies based on UDP, utilized from streamlining repetitive actions and avoiding long and complex instructions repetition. Any additional data byte after the INSTRUCTION byte for a non-specifiers instruction will be ignored by the SCPS module. The $1^{st}$ two LSB of the INSTRUCTION byte are utilized for command identification (future revisions might consider an additional INSTRUCTION byte, in order to significantly extending the command domain). The following table shows an example of a possible Setup instruction format.

SETUP instruction summary
INSTRUCTION BYTE 1000XXXX

| Group 10001XXX | | | Member 10000XXX | | |
|---|---|---|---|---|---|
| Code | Function | Parameters | Code | Function | Parameters |
| 000 | RESET | N/A | 000 | RESET | N/A |
| 001 | STATE1 | N/A | 001 | STATE1 | N/A |
| 010 | STATE2 | N/A | 010 | STATE2 | N/A |
| 011 | STATE3 | N/A | 011 | STATE3 | N/A |
| 100 | WRITE | REG-ADDR | 100 | WRITE | REG-ADDR |
| 101 | reserved | reserved | 101 | reserved | reserved |
| 110 | LOCK | TYPE | 110 | LOCK | TYPE |
| 111 | RQST RELEASE | TOKEN | 111 | reserved | reserved |

The Token Register (or TKR) stores the information of the associated resources that have been assigned to a specific module. The purpose is to use this register as a TOKEN space where each bit represents a specific TOKEN. In the case of only one shared resource (such as an analogue bus) then there is no need for the TKR since the RQST flag would suffice.

Facilitates the implementation of token strategies through the use of global instruction set for resource request, which instantiates a mechanism for resource availability verification.

When using the SCPS module for token strategies, it is assumed that the involved modules will verify the availability of the resource prior to usage and it is the responsibility of the designer to implement any related safeguards.

The invention claimed is:

1. A Setup, Capture, Process and Scan (SCPS) module, comprising:
    an interpreter sub-module; and
    a register bank module comprising:
        an instruction register;
        a state register;
        a status register;
        a group address register;
        a member address register;
        a write register pointer register;
        a read register pointer register;
        a group write pointer register;
        a group read pointer register;
    wherein the interpreter sub-module is configured to receive and respond to I3C (augmented inter integrated circuit sequences, supplemented with SCPS sequences, on reception of an instruction preceded by any of:
    an I3C address;
    a global SCPS address comprising an I3C global address call followed by a SCPS global instruction, (SGI);
    a group SCPS address comprising a 10-bit I3C address followed by an 8-bit group SCPS address and by a group instruction; or
    a member-specific SCPS address comprising a group SCPS address, followed by a member address and a member-specific instruction,
    wherein the register bank module comprises one or more token registers.

2. The module according to claim 1, wherein the register bank module comprises at least one user defined register.

3. The module according to claim 1, comprising an element bank add-on SCPS handler sub-module.

4. The module according to claim 1, wherein the SCPS global instruction (SGI) comprises:

a state instruction;
a lock instruction; or
a request instruction.

5. The module according to claim 1, wherein the group or member-specific instruction comprises:
   a setup instruction set;
   a capture instruction set;
   a process instruction set; or
   a scan instruction set.

6. The module according to claim 1, wherein said module is configured to implement a method of operating a setup, capture, process and scan (SPCS) module, comprising the steps of:
   storing the last valid entered instruction, in the instruction register;
   storing the current action state of the instruction in the state register;
   storing the internal status of the SCPS module in the status register;
   storing the group address of the current module in the group address register;
   storing the specific address of the module within the group of the current module in the member address register;
   storing the target register address to be written to in the write register pointer register;
   storing the target register address to be read from in the read register pointer register;
   storing the member address to be written to in the group write pointer register; and
   storing the member address to be read from in the group read pointer register.

7. A mixed signal bus, comprising at least one of device comprising a setup, capture, process and scan (SCPS) module according to claim 1, a connection to the at least one device, wherein the at least one device comprises a shared resource.

8. A method of operating a setup, capture, process and scan (SPCS) module, comprising the steps of:
   executing a setup instruction by clearing, flags or registers, writing or updating registers;
   executing a state instruction by modifying a state register among the registers, clearing a pointer registers among the registers, clearing internal flags and clearing a token register among the registers, if present, except a global flag if present;
   executing a lock instruction by setting a lock level for the SCPS module;
   executing a request instruction by coordinating use of shared resources through availability verification;
   storing a last valid entered instruction, in an instruction register;
   storing a current action state of the state instruction in the state register;
   storing an internal status of the SCPS module in a status register;
   storing a group address of the current module in a group address register;
   storing a specific address of the module within a group of the current module in a member address register;
   storing a target register address to be written to in a write register pointer register;
   storing a target register address to be read from in a read register pointer register;
   storing a member address to be written to in a group write pointer register; and
   storing a member address to be read from in a group read pointer register.

9. The method of claim 8, further comprising the step of:
   storing a token space of the associated resources that have been assigned to a specific module in a token register having bits,
   wherein each bit(s) of the token register represents a specific token for a specific shared resource.

10. The method according to claim 8, comprising the steps:
    executing a capture instruction by initiating multiple step sequential setups, direct accessing specific pre-arranged setups, sending setup parameters, starting a capture or ending a capture;
    executing a process instruction by synchronizing inter-module actions that have no direct inter-module dependency, through the use of pre-established dependent STATES or through the use of specifiers, both at a group level or member-specific; and
    executing a scan instruction by reading or transferring from registers of the addressed modules.

* * * * *